(12) United States Patent
Tian et al.

(10) Patent No.: US 12,120,906 B2
(45) Date of Patent: Oct. 15, 2024

(54) DISPLAY SUBSTRATE, DISPLAY DEVICE, AND METHOD FOR MANUFACTURING DISPLAY SUBSTRATE

(71) Applicant: BOE Technology Group Co., Ltd., Beijing (CN)

(72) Inventors: Hongwei Tian, Beijing (CN); Yanan Niu, Beijing (CN); Hejin Wang, Beijing (CN); Pinfan Wang, Beijing (CN); Fangxu Cao, Beijing (CN); Zheng Liu, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 453 days.

(21) Appl. No.: 17/630,116

(22) PCT Filed: Apr. 22, 2021

(86) PCT No.: PCT/CN2021/089063
§ 371 (c)(1),
(2) Date: Jan. 25, 2022

(87) PCT Pub. No.: WO2021/238525
PCT Pub. Date: Dec. 2, 2021

(65) Prior Publication Data
US 2022/0263047 A1     Aug. 18, 2022

(30) Foreign Application Priority Data
May 26, 2020    (CN) .......................... 202010453154.1

(51) Int. Cl.
*H10K 59/12*     (2023.01)
*H10K 50/844*     (2023.01)
(Continued)

(52) U.S. Cl.
CPC ......... *H10K 50/844* (2023.02); *H10K 59/131* (2023.02); *H10K 71/00* (2023.02); *H10K 59/1201* (2023.02); *H10K 59/122* (2023.02)

(58) Field of Classification Search
CPC .... H10K 59/131; H10K 59/122; H10K 71/00; H10K 50/844
(Continued)

(56) References Cited

U.S. PATENT DOCUMENTS

2017/0115818 A1    4/2017   Cai et al.
2017/0279057 A1    9/2017   Park et al.
(Continued)

FOREIGN PATENT DOCUMENTS

CN    107221550 A      9/2017
CN    109935730 A   *   6/2019     ......... H01L 27/3276
(Continued)

OTHER PUBLICATIONS

CN202010453154.1 first office action.

*Primary Examiner* — Phuc T Dang
(74) *Attorney, Agent, or Firm* — IPro, PLLC

(57) ABSTRACT

Provided are a display substrate, a display device, and a method for manufacturing the display substrate. The display substrate includes: a first inorganic encapsulation layer covering pixels of an island region and covering a signal line of a bridge region, a first organic encapsulation layer covering the first inorganic encapsulation layer, and multiple insulating layers located in the bridge region and between the first inorganic encapsulation layer and a substrate.

20 Claims, 7 Drawing Sheets

(51) Int. Cl.
*H10K 59/131* (2023.01)
*H10K 71/00* (2023.01)
*H10K 59/122* (2023.01)

(58) Field of Classification Search
USPC .......................................................... 257/91
See application file for complete search history.

(56) References Cited

U.S. PATENT DOCUMENTS

2018/0040677 A1  2/2018  Hong et al.
2021/0192983 A1  6/2021  Sui et al.
2021/0257434 A1  8/2021  Xie et al.

FOREIGN PATENT DOCUMENTS

| | | | | |
|---|---|---|---|---|
| CN | 110323265 A | | 10/2019 | |
| CN | 110494985 A | * | 11/2019 | ......... H01L 27/3244 |
| CN | 110993679 A | | 4/2020 | |
| CN | 111162197 A | | 5/2020 | |
| CN | 111524952 A | | 8/2020 | |
| CN | 111584750 A | | 8/2020 | |

* cited by examiner

DISPLAY SUBSTRATE, DISPLAY DEVICE, AND METHOD FOR MANUFACTURING DISPLAY SUBSTRATE

CROSS REFERENCE TO RELATED APPLICATIONS

The present disclosure is a US National Stage of International Application No. PCT/CN2021/089063, filed on Apr. 22, 2021, which claims priority to Chinese Patent Application No. 202010453154.1, filed to the China Patent Office on May 26, 2020 and entitled "DISPLAY SUBSTRATE, DISPLAY DEVICE, AND METHOD FOR MANUFACTURING DISPLAY SUBSTRATE", the entire content of which is incorporated herein by reference.

FIELD

The present disclosure relates to the field of display, in particular to a display substrate, a display device, and a method for manufacturing the display substrate.

BACKGROUND

An organic electro luminescent display (OLED) substrate has gradually become the mainstream in the display field with its excellent performance of low power consumption, high color saturation, wide viewing angle, thin thickness, flexibility and the like. It can be widely used in smart phones, flat panel computers, televisions and other terminal products. Among them, flexible OLED products are the most significant, and gradually become the mainstream of OLED display because they can meet various special structures.

With the development of flexible technology, flexible stretchable display has gradually changed from bendable and foldable to stretchable. The flexible stretchable display has attracted extensive attention in the market because of its broad application space. At the same time, the development of flexible stretchable display also faces many technical challenges.

SUMMARY

An embodiment of the present disclosure provides a display substrate, including a base substrate; a plurality of island regions located on one side of the base substrate; an empty region located between adjacent island regions; and a plurality of bridge regions, connecting the adjacent island regions, wherein each island region includes at least one pixel, and each bridge region includes signal lines connecting pixels in the adjacent island regions.

The display substrate further includes: a first inorganic encapsulation layer covering pixels of the island regions and the signal lines in the bridge regions, a first organic encapsulation layer covering the first inorganic encapsulation layer, and a plurality of insulation layers located between the first inorganic encapsulation layer and the base substrate in the bridge regions.

At least one insulation layer has at least one first groove recessed to one side of the base substrate in the bridge regions, the first inorganic encapsulation layer has corresponding concave second grooves at positions corresponding to the at least one first groove, and the second grooves enable two adjacent island regions to communicate, and are configured to make a printing liquid flow to the adjacent island regions when forming the printing liquid of the first organic encapsulation layer of the current island region.

In a possible implementation, each insulation layer includes at least one of the followings sequentially located on one side of the base substrate: a buffer layer; a first gate insulation layer; a second gate insulation layer; an interlayer insulation layer; a flat layer; a pixel definition layer; and a spacer.

In a possible implementation, an orthographic projection of the at least one first groove on the base substrate covers orthographic projections of the signal lines on the base substrate.

The insulation layer includes the buffer layer, the first gate insulation layer, the second gate insulation layer, the interlayer insulation layer, the flat layer, the pixel definition layer, and the spacer which are sequentially located on one side of the base substrate.

The signal lines are located between the interlayer insulation layer and the flat layer, and the at least one first groove is recessed to the flat layer from a surface of one side of the spacer facing away from the pixel definition layer.

In a possible implementation, the at least one first groove is recessed to an interior of the flat layer.

In a possible implementation, an orthographic projection of the at least one first groove on the base substrate does not overlap orthographic projections of the signal lines on the base substrate.

The insulation layer includes the buffer layer, the first gate insulation layer, the second gate insulation layer, the interlayer insulation layer, the flat layer, the pixel definition layer, and the spacer which are sequentially located on one side of the base substrate.

The signal lines are located between the interlayer insulation layer and the flat layer, and the at least one first groove is recessed to the buffer layer from the surface of the side of the spacer facing away from the pixel definition layer.

In a possible implementation, the at least one first groove is recessed to an interior of the buffer layer.

In a possible implementation, the empty region is of a hollow structure.

In a possible implementation, a first surface and a second surface of the first organic encapsulation layer are in a same plane, wherein the first surface is a surface of the first organic encapsulation layer facing away from the first inorganic encapsulation layer in the island regions, and the second surface is a surface of the first organic encapsulation layer facing away from the first inorganic encapsulation layer in the bridge regions.

In a possible implementation, the display substrate further includes a second organic encapsulation layer located between the first organic encapsulation layer and the first inorganic encapsulation layer, and in a region where the at least one first groove is located, a thickness of the second organic encapsulation layer in a direction perpendicular to the base substrate is less than a thickness of the first organic encapsulation layer in the direction perpendicular to the base substrate.

In a possible implementation, the second organic encapsulation layer covers only a bottom and a side wall of the at least one first groove.

In a possible implementation, the display substrate further includes: a second inorganic encapsulation layer located on one side of the first organic encapsulation layer facing away from the first inorganic encapsulation layer.

An embodiment of the present disclosure further provides a display device, including the display substrate provided by the embodiment of the present disclosure.

An embodiment of the present disclosure further provides a method for manufacturing the display substrate provided by the embodiment of the present disclosure, including: forming a plurality of insulation layers on one side of a base substrate; forming at least one first groove in a bridge region of at least one insulation layer; forming a first inorganic encapsulation layer on one side of the at least one first groove facing away from the insulation layers, wherein the first inorganic encapsulation layer has corresponding concave at positions corresponding to the at least one first groove to form second grooves; and printing a printing liquid for forming a first organic encapsulation layer on one side of the first inorganic encapsulation layer facing away from the insulation layer, so that when printing a printing liquid of a current island region, the printing liquid flows to other island regions through the second grooves.

In a possible implementation, the printing the printing liquid for forming the first organic encapsulation layer on one side of the first inorganic encapsulation layer facing away from the insulation layer further includes: printing the printing liquid for forming the first organic encapsulation layer only on one of the plurality of island regions connected through the second grooves.

In a possible implementation, before the printing the printing liquid for forming the first organic encapsulation layer on one side of the first inorganic encapsulation layer facing away from the insulation layer, the manufacturing method further includes: printing a printing liquid for forming a second organic encapsulation layer in the at least one first groove, wherein a viscosity of the printing liquid forming the second organic encapsulation layer is lower than a viscosity of the printing liquid forming the first organic encapsulation layer.

DETAILED DESCRIPTION OF THE EMBODIMENTS

In order to make the objectives, technical solutions and advantages of embodiments of the present disclosure clearer, the technical solutions of the embodiments of the present disclosure will be described clearly and completely with reference to accompanying drawings of the embodiments of the present disclosure. Obviously, the described embodiments are part of, rather than all of, embodiments of the present disclosure. Based on the described embodiments of the present disclosure, all other embodiments obtained by those ordinarily skilled in the art without creative labor fall within the protection scope of the present disclosure.

Unless otherwise defined, technical or scientific terms used in the present disclosure shall have the usual meanings understood by those with ordinary skills in the field to which the present disclosure belongs. "First", "second" and similar words used in the present disclosure do not indicate any order, quantity or importance, but are only used to distinguish different components. "Comprise" or "include" or other similar words mean that the element or item appearing before the word encompasses the element or item listed after the word and its equivalents, but does not exclude other elements or items. "Connecting" or "connected" or other similar words are not limited to physical or mechanical connections, but may include electrical connections, whether direct or indirect. "Upper", "lower", "left", "right", etc. are only used to indicate a relative position relationship which may change accordingly when the absolute position of an object being described changes.

In order to keep the following description of embodiments of the present disclosure clear and concise, the present disclosure omits detailed descriptions of known functions and known assemblies.

Figure 1:
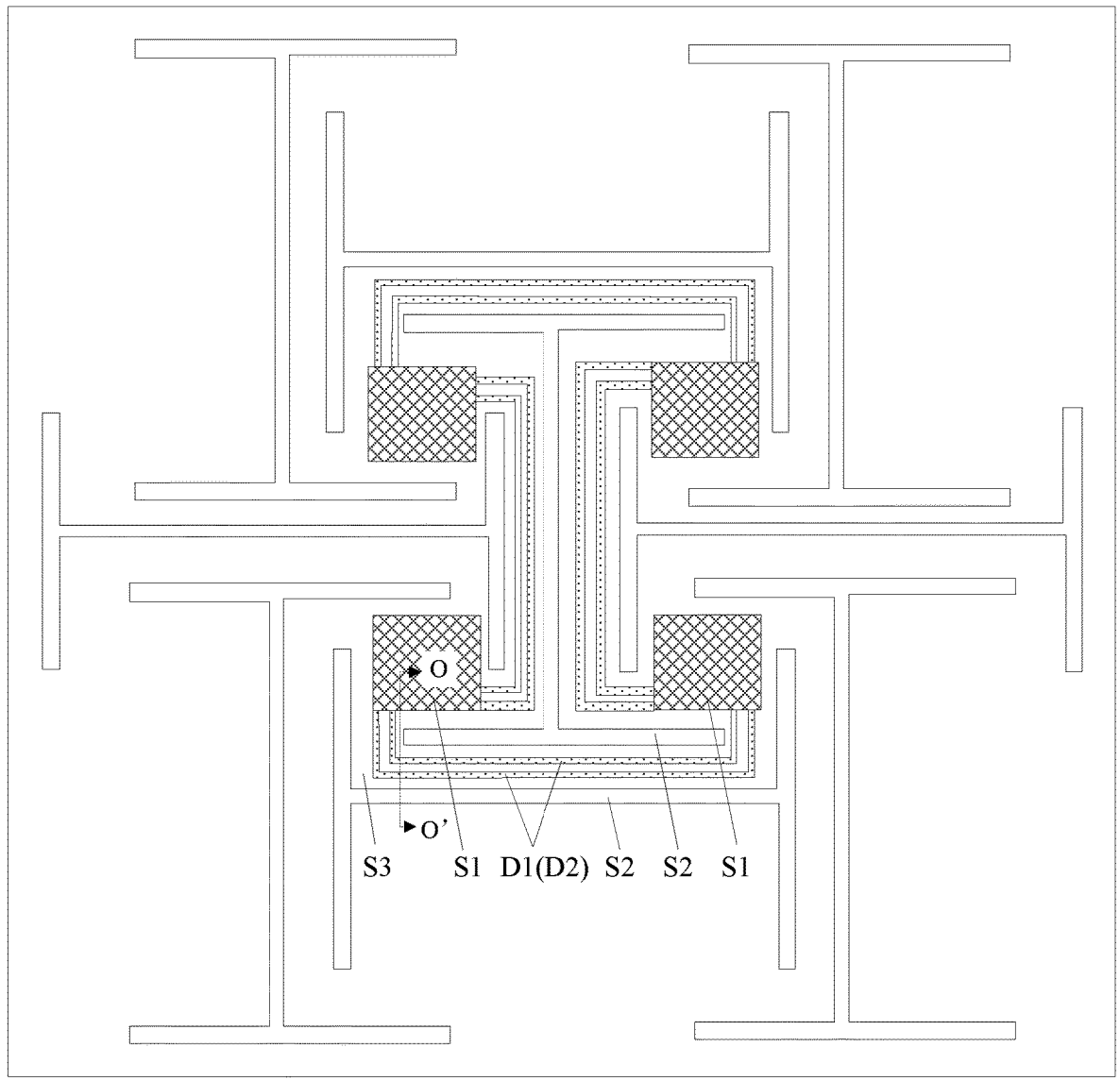
FIG. 1 is a schematic top view of a display substrate provided by an embodiment of the present disclosure.
Figure 2A:
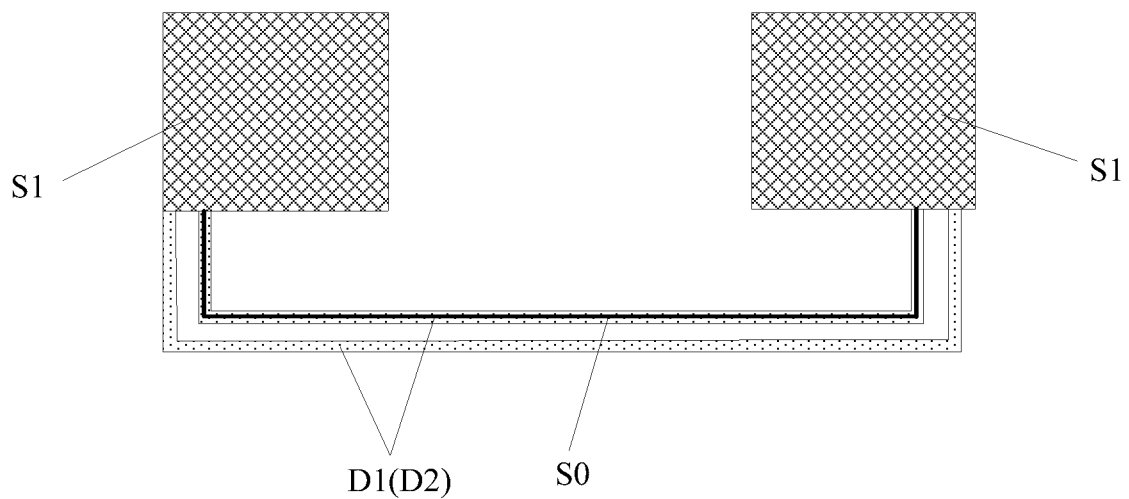
FIG. 2A is a schematic top view of a first groove overlapping a signal line provided by an embodiment of the present disclosure.
Figure 2B:
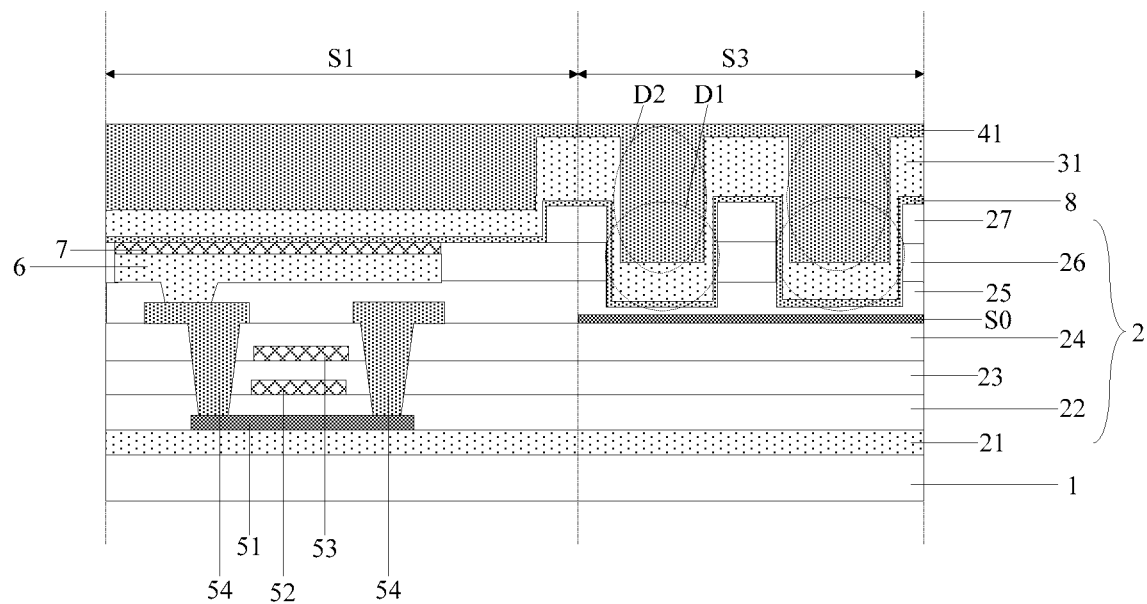
FIG. 2B is a schematic sectional view of FIG. 1 at 00'.

Referring to FIG. 1 and FIG. 2B, FIG. 2B is a schematic sectional view of FIG. 1 at 00'. An embodiment of the present disclosure provides a display substrate, including a base substrate 1, a plurality of island regions S1 located on one side of the base substrate, an empty region S2 located between adjacent island regions S1, and bridge regions S3 connecting the adjacent island regions S1. Each island region S1 includes at least one pixel (not shown in FIG. 1). Each bridge region S3 includes one or more signal lines (not shown in FIG. 1) connecting pixels in the adjacent island regions S1. The empty region S2 specifically may be of a hollow structure without the base substrate 1 and film layers on the base substrate 1. The base substrate 1 specifically may be a flexible base substrate.

The display substrate further includes a first inorganic encapsulation layer 31 covering the pixels of the island regions S1 and the signal lines in the bridge regions S3, a first organic encapsulation layer 41 covering the first inorganic encapsulation layer 31, and a plurality of insulation layers 2 located between the first inorganic encapsulation layer 31 and the base substrate 1 in the bridge regions S3.

At least one insulation layer 2 has at least one first groove D1 recessed to one side of the base substrate 1 in the bridge regions S3, the first inorganic encapsulation layer 31 has corresponding concave second grooves D2 at positions corresponding to the first grooves D1, and the second grooves D2 enable two adjacent island regions S1 to communicate, and are configured to make a printing liquid flow to the adjacent island regions S1 when forming the printing liquid of the first organic encapsulation layer 41 of the current island region S1.

According to the display substrate provided by the embodiment of the present disclosure, by forming the first grooves D1 on at least one insulation layer 2 in the bridge regions S3, the first inorganic encapsulation layer 31 is correspondingly recessed at the positions of the first grooves D1 to form the corresponding second grooves D2. The second grooves D2 enable two adjacent island regions S1 to communicate. When the first organic encapsulation layer 41 is subsequently formed by ink-jet printing, an organic encapsulation material is printed on one of the island regions S1, and an organic encapsulation material of the current island region S1 may flow to the adjacent island region S1 along the second grooves D2, so the organic encapsulation material can be printed on one island region S1 to form the organic encapsulation layer covering the plurality of island regions S1, reducing the quantity of ink-jet printing, and avoiding the problem that it takes a long time to print each island region S1 separately.

In specific implementation, the same bridge region S3 can form one second groove D2. Alternatively, two second grooves D2 may be formed, as shown in FIG. 1. Alternatively, more second grooves D2 may be formed, and the quantity of the second grooves D2 in the same bridge region S3 may be flexibly set according to needs. A direction of each second groove D2 may be consistent with a direction of the bridge region S3.

In specific implementation, as shown in FIG. 2B, each insulation layer 2 specifically includes one or a combination of the followings sequentially located on one side of the base substrate 1: a buffer layer 21; a first gate insulation layer 22; a second gate insulation layer 23; an interlayer insulation layer 24; a flat layer 25; a pixel definition layer 26; and a spacer 27.

In the embodiment of the present disclosure, the insulation layer 2 of the bridge regions S3 may include the buffer layer 21, the first gate insulation layer 22, the second gate insulation layer 23, the interlayer insulation layer 24, the flat layer 25, the pixel definition layer 26, and the spacer 27 which are sequentially located on one side of the base substrate 1. Alternatively, the insulation layer 2 of the bridge regions S3 may include only part of the film layers. For example, the insulation layer 2 of the bridge regions S3 may include the buffer layer 21, the flat layer 25, the pixel definition layer 26, and the spacer 27 which are sequentially located on one side of the base substrate 1. That is, the bridge regions S3 do not retain the first gate insulation layer 22, the second gate insulation layer 23, and the interlayer insulation layer 24 relative to the island regions S1. Alternatively, the insulation layer 2 of the bridge regions S3 may include other combinations of the above film layers, which will not be described in detail here.

Specifically, as shown in FIG. 2B, between the base substrate 1 and the first inorganic encapsulation layer 31, each island region S1 may sequentially include: a buffer layer 21, a low temperature poly-silicon (LTPS) active layer 51, a first gate insulation layer 22, a first gate layer 52, a second gate insulation layer 23, a second gate layer 53, an interlayer insulation layer 24, a source drain layer 54 (specifically including a source and a drain), a flat layer 25, an anode layer 6, a pixel definition layer 26, a spacer 27, an organic light emitting layer 7, and a cathode layer 8.

In specific implementation, since both the first grooves D1 and the signal lines are located in the bridge regions S3, a slotting depth of the first grooves D1 needs to take into account a position of the signal lines, which is described in detail below.

For example, as shown in FIG. 2A and FIG. 2B, orthographic projections of the first grooves D1 on the base substrate 1 cover orthographic projections of the signal lines S0 on the base substrate 1. The insulation layer 2 of the bridge regions S3 may include the buffer layer 21, the first gate insulation layer 22, the second gate insulation layer 23, the interlayer insulation layer 24, the flat layer 25, the pixel definition layer 26, and the spacer 27 which are sequentially located on one side of the base substrate 1. The signal lines S0 are generally located between the interlayer insulation layer 24 and the flat layer 25 (that is, in the same layer as the source and the drain), and the first grooves D1 may be recessed to the flat layer 25 from a surface of one side of the spacer 27 facing away from the pixel definition layer 26.

In the embodiment of the present disclosure, the orthographic projections of the first grooves D1 on the base substrate 1 cover the orthographic projections of the signal lines S0 on the base substrate 1. When the signal lines S0 are located between the interlayer insulation layer 24 and the flat layer 25, the first grooves D1 are recessed to the flat layer 25 from the surface of one side of the spacer 27 facing away from the pixel definition layer 26. That is, bottoms of the first grooves D1 terminate at the flat layer 25 to prevent the signal lines S0 from being disconnected when the first grooves D1 are further recessed to one side of the base substrate 1, thereby affecting a signal transmission between the adjacent island regions S1.

Specifically, the first grooves D1 may be recessed to an interior of the flat layer 25. In the embodiment of the present disclosure, since the signal lines S0 of the bridge regions S3 are below the flat layer 25, if the first grooves D1 are dug to a lower end surface of the flat layer 25, that is, bottom surfaces of the first grooves D1 are a surface of the flat layer 25 facing the base substrate 1, which may cause certain damage to the signal lines S0.

Figure 3A:
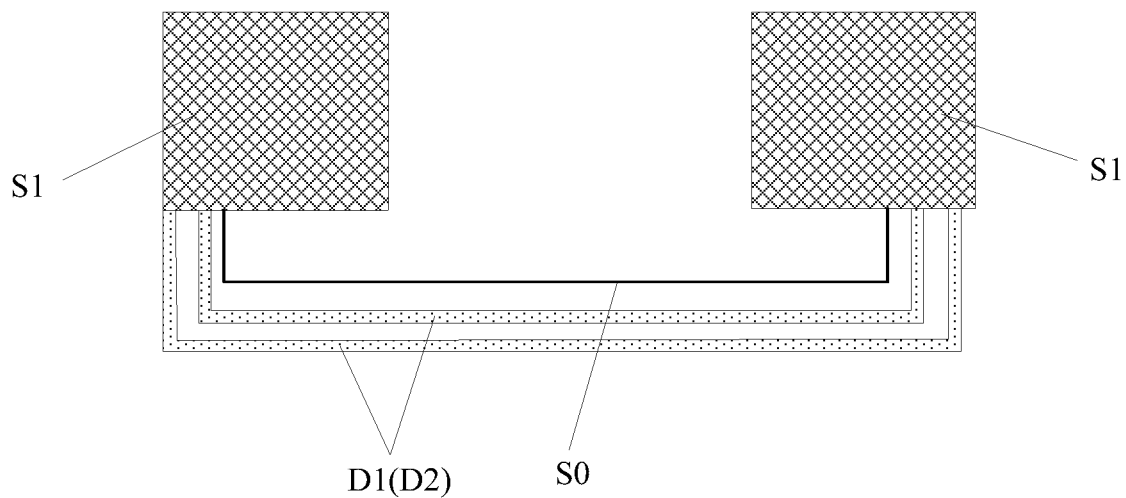
FIG. 3A is a schematic top view of a first groove not overlapping a signal line provided by an embodiment of the present disclosure.
Figure 3B:
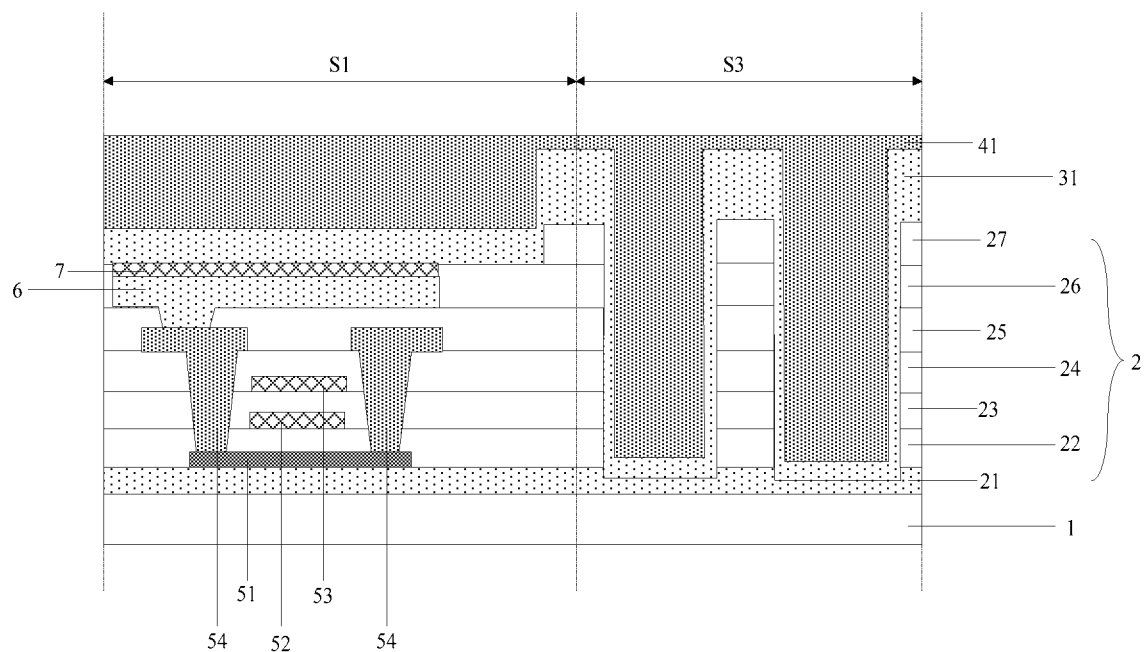
FIG. 3B is a schematic sectional view of a first groove not overlapping a signal line provided by an embodiment of the present disclosure.

For another example, as shown in FIG. 3A and FIG. 3B, the orthographic projections of the first grooves D1 on the base substrate 1 do not overlap the orthographic projections of the signal lines S0 on the base substrate 1. The insulation layer 2 of the bridge regions S3 may include the buffer layer 21, the first gate insulation layer 22, the second gate insulation layer 23, the interlayer insulation layer 24, the flat layer 25, the pixel definition layer 26, and the spacer 27 which are sequentially located on one side of the base substrate 1. The signal lines S0 are generally located between the interlayer insulation layer 24 and the flat layer 25, and the first grooves D1 are recessed to the buffer layer 21 from the surface of one side of the spacer 27 facing away from the pixel definition layer 26.

In the embodiment of the present disclosure, the orthographic projections of the first grooves D1 on the base substrate 1 do not overlap the orthographic projections of the signal lines S0 on the base substrate 1. When the signal lines S0 are located between the interlayer insulation layer 24 and the flat layer 25, the first grooves D1 are recessed to the buffer layer 21 from the surface of one side of the spacer 27 facing away from the pixel definition layer 26. That is, positions of the first grooves D1 are misaligned with the positions of the signal lines S0, so it is unnecessary to consider that the first grooves D1 will disconnect the signal lines S0, so that the first grooves D1 extend all the way to the buffer layer 21. In this way, deep first grooves D1 may be formed to prevent the organic encapsulation material from flowing to a region outside the island regions S1 during a flow process.

Specifically, the first grooves D1 may be recessed to an interior of the buffer layer 21. In the embodiment of the present disclosure, the first grooves D1 are recessed to an interior of the buffer layer 21, and the depth of the first grooves is large, so that a flow space and a rate of a first printing liquid for forming the first organic encapsulation layer are relatively large. However, since most inorganic layers of the bridge regions S3 are removed, if the first grooves D1 are recessed to a surface of the buffer layer 21 facing the base substrate 1, it may cause certain potential damage to a structure below the buffer layer 21. Therefore, the first grooves D1 generally do not exceed the buffer layer 21. In addition, considering a process fluctuation, if a depth target of the first grooves D1 is set as a lower end face of the buffer layer 21, it will actually penetrate the buffer layer 21 with a high probability and go deeper into more distances below the buffer layer 21, resulting in unnecessary damage.

It should be noted that FIG. 2A and FIG. 3A are only a schematic illustration taking the bridge region S3 provided with one signal line S0 and two first grooves D1 as an example, and the present disclosure is not limited thereto. Similarly, FIG. 1 is only a schematic illustration of part of the island region, part of the bridge region and part of the empty region of the display substrate. The island region, the bridge region, and the empty region can also be distributed in other shapes, which is not limited to this disclosure.

In specific implementation, as shown in FIG. 2B and FIG. 3B, a first surface and a second surface of the first organic encapsulation layer 41 are in a same plane. The first surface is a surface of the first organic encapsulation layer 41 facing away from the first inorganic encapsulation layer 31 in the island regions S1, and the second surface is a surface of the first organic encapsulation layer 41 facing away from the first inorganic encapsulation layer 31 in the bridge regions S3. Of course, it can be understood that due to an actual process error, the strict plane is difficult to realize. The same plane in the embodiment of the present disclosure may be understood as that the first surface and the second surface are basically in the same plane. In the embodiment of the present disclosure, the first surface and the second surface of the first organic encapsulation layer 41 are in the same plane, which can have good encapsulation effect and avoid a problem of poor display due to the uneven surfaces of the first organic encapsulation layer 41.

Figure 4:
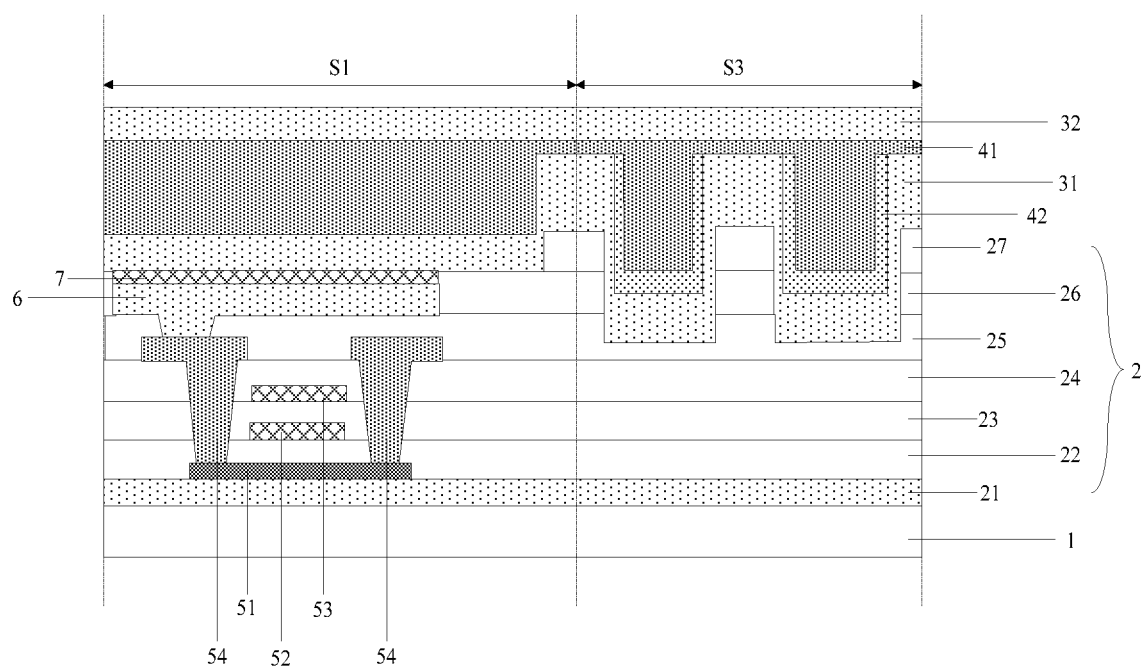
FIG. 4 is a schematic structural diagram of a display substrate provided with a second inorganic encapsulation layer provided by an embodiment of the present disclosure.
Figure 5:
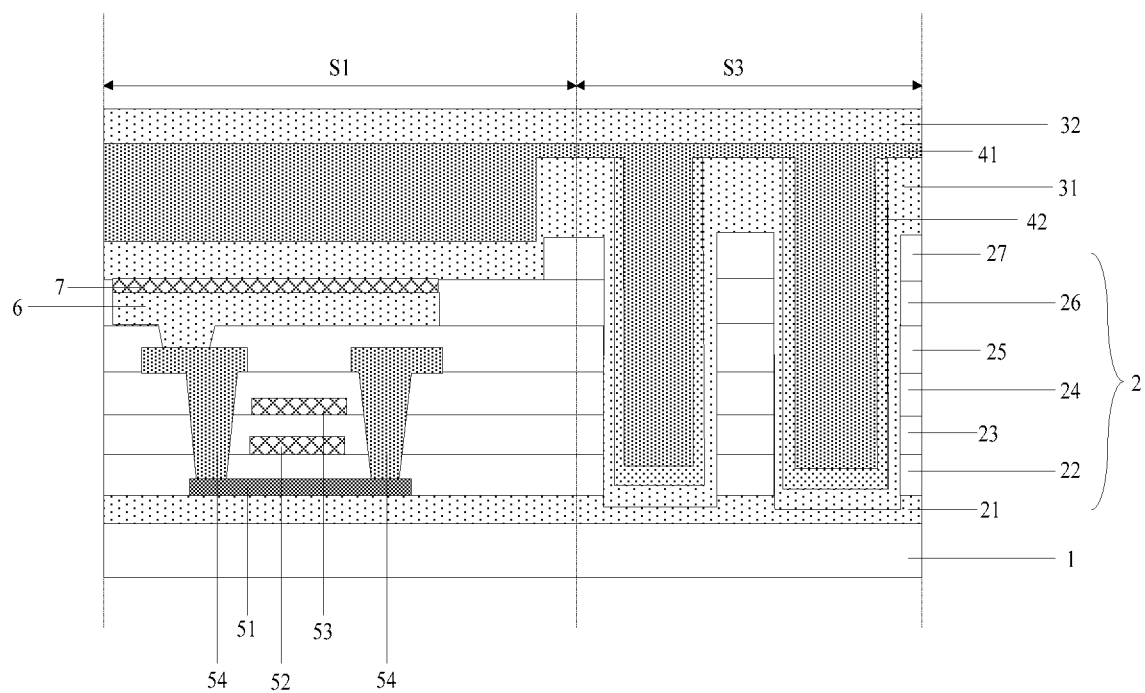
FIG. 5 is another schematic structural diagram of a display substrate provided with a second inorganic encapsulation layer provided by an embodiment of the present disclosure.

In specific implementation, as shown in FIG. 4 and FIG. 5, a second organic encapsulation layer 42 is further located between the first organic encapsulation layer 41 and the first inorganic encapsulation layer 31. In a region where the first grooves D1 are located, a thickness of the second organic encapsulation layer 42 in a direction perpendicular to the base substrate 1 is less than a thickness of the first organic encapsulation layer 41 in the direction perpendicular to the base substrate 1. In the embodiment of the present disclosure, the second organic encapsulation layer 42 is further located between the first organic encapsulation layer 41 and the first inorganic encapsulation layer 31. When making the second organic encapsulation layer 42, a viscosity of a second printing liquid forming the second organic encapsulation layer 42 may be lower than a viscosity of the first printing liquid with normal viscosity forming the first organic encapsulation layer 41, which may promote a fluidity of the first printing liquid with normal viscosity in the second grooves D2, so as to better cover more island regions S1. That is, by making the corresponding first grooves D1, a coarse embryo of a capillary structure is formed, and the effective capillary structure is formed through a two-step process, which may better improve a convection leveling effect, and achieve better leveling and display effect when process beat time remains unchanged.

In specific implementation, as shown in FIG. 4 and FIG. 5, the second organic encapsulation layer 42 covers only the bottoms and side walls of the first grooves D1. Specifically, the second organic encapsulation layer 42 may cover only the bottoms and the side walls of the first grooves D1.

In specific implementation, as shown in FIG. 4 and FIG. 5, a second inorganic encapsulation layer 32 is located on one side of the first organic encapsulation layer 41 facing away from the first inorganic encapsulation layer 31.

It should be noted that in FIG. 3B, FIG. 4 and FIG. 5, a cathode layer 8 is also located between the organic light emitting layer 7 and the first inorganic encapsulation layer 31, which covers the island regions S1 and the bridge regions S3.

Based on a same inventive concept, an embodiment of the present disclosure further provides a display device, including the display substrate provided by the embodiment of the present disclosure.

Figure 6:
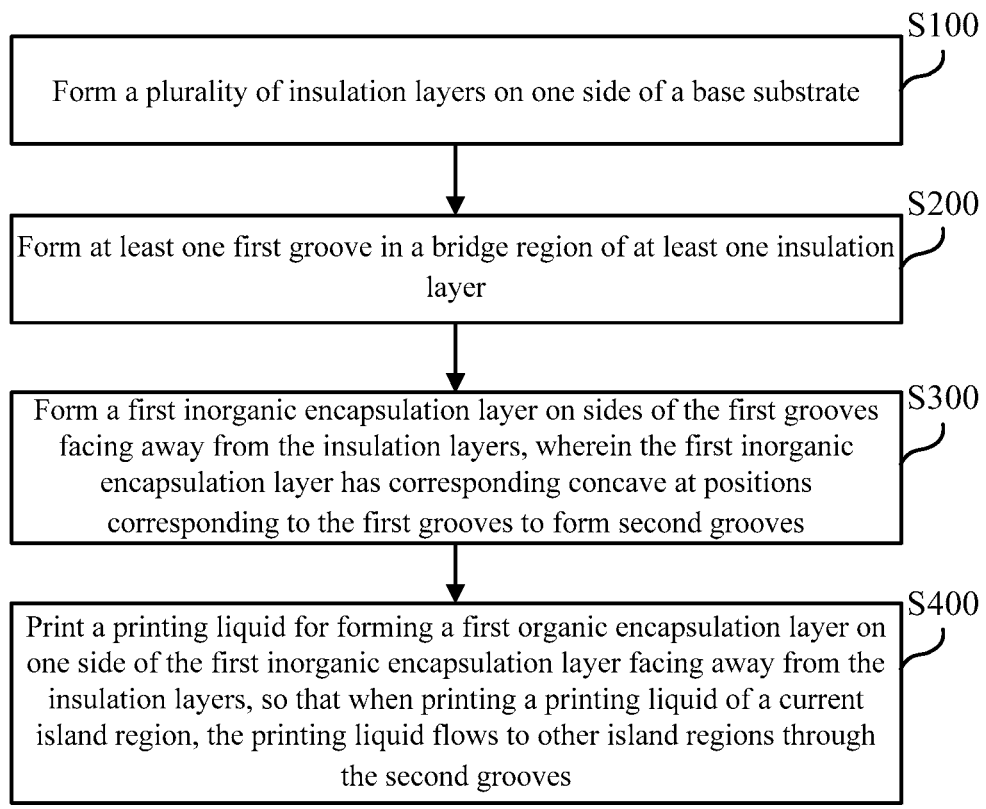
FIG. 6 is a manufacturing flow chart of a display substrate provided by an embodiment of the present disclosure.

Referring to FIG. 6, an embodiment of the present disclosure further provides a method for manufacturing the display substrate provided by the embodiment of the present disclosure, including the following operations.

S100, a plurality of insulation layers are formed on one side of a base substrate.

S200, at least one first groove is formed in a bridge region of at least one insulation layer.

S300, a first inorganic encapsulation layer is formed on sides of the first grooves facing away from the insulation layers, where the first inorganic encapsulation layer has corresponding concave at positions corresponding to the first grooves to form second grooves.

S400, a printing liquid for forming a first organic encapsulation layer is printed on one side of the first inorganic encapsulation layer facing away from the insulation layer, so that when printing a printing liquid of a current island region, the printing liquid flows to other island regions through the second grooves.

Figure 7:
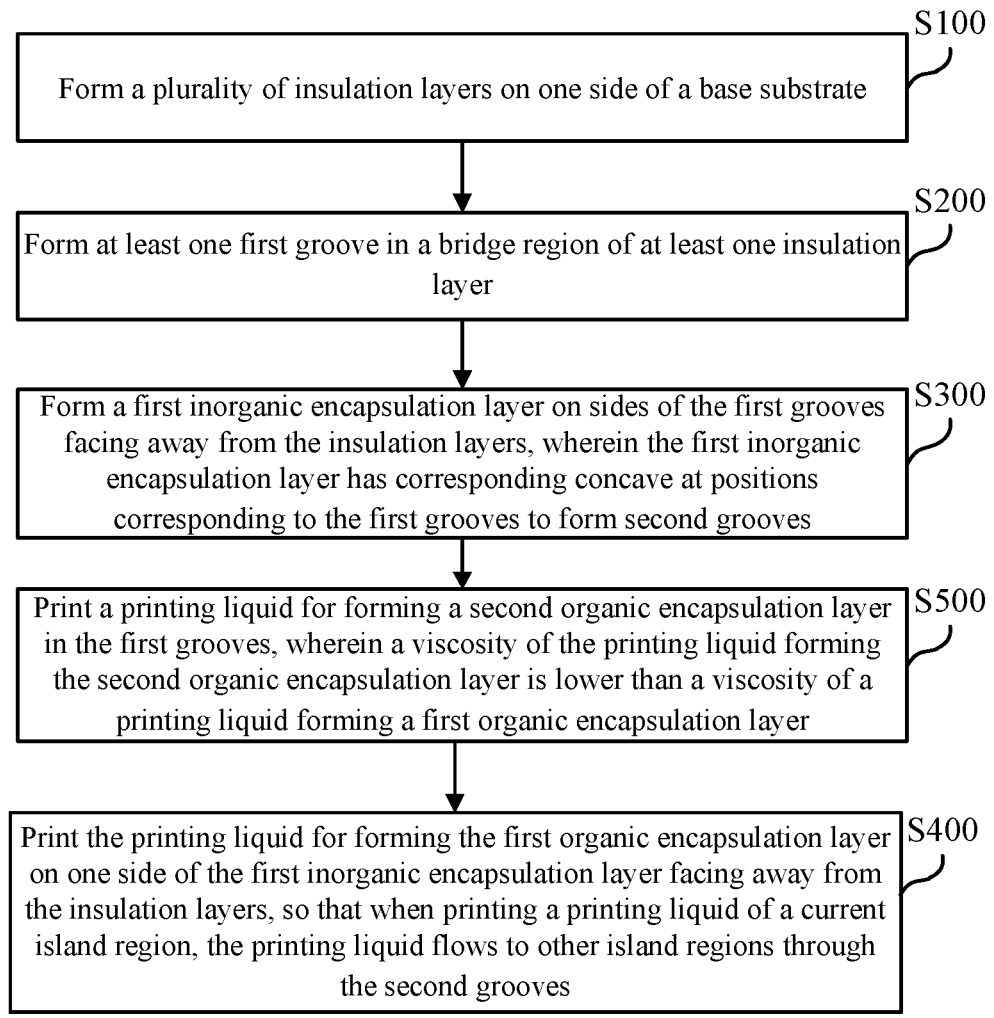
FIG. 7 is a manufacturing flow chart of a specific display substrate provided by an embodiment of the present disclosure.

In specific implementation, as shown in FIG. 7, before the step S400, that is, before the printing liquid for forming the first organic encapsulation layer is printed on the side of the first inorganic encapsulation layer facing away from the insulation layer, the method further includes the following operation.

S500, a printing liquid for forming a second organic encapsulation layer is printed in the first grooves, where a viscosity of the printing liquid forming the second organic encapsulation layer is lower than a viscosity of the printing liquid forming the first organic encapsulation layer.

Taking the display substrate shown in FIG. 2B as an example, the method for manufacturing the display substrate provided by the embodiment of the present disclosure is further described in detail as follows.

Step one, graphing of a buffer layer 21 (buffer), a low temperature poly-silicon active layer 51 (active), a first gate layer 52 (gate1) and a second gate layer 53 (gate2) is normally completed on the base substrate 1 (a flexible base substrate). The corresponding island-bridge division may start from the buffer layer 21.

Step two, graphing of an interlayer insulation layer 24 (ILD), a source drain layer 54 (S/D), a flat layer 25 (PLN), an anode layer 6 (pixel), a pixel definition layer 26 (PDL), a spacer 27 (i.e., a spacing layer PS) is completed, and a backplane process is completed.

Step three, along a trend of island-bridge regions, the bridge regions are grooved accordingly, and PLN-PDL-PS is adopted to form a Dam barrier along grooves, that is, the first grooves D1 are formed.

Step four, an EL evaporation process is carried out, in which an EL is graphical and exists only in the island regions.

Step five, the first inorganic encapsulation layer 31 is deposited by adopting a chemical vapor deposition (CVD) method.

Step six, the second organic encapsulation layer 42 is manufactured on the first inorganic encapsulation layer 31, that is, a process of low-viscosity ink jet print (IJP) is adopted. A thickness of the low-viscosity IJP may be 200 nm to 4000 nm. Subject to leveling to a sufficient pixel distance, the low-viscosity IJP is configured as a capillary coating to promote the leveling of normal-viscosity IJP of the first organic encapsulation layer 41.

Step seven, the IJP process with normal viscosity is carried out, so that IJP with normal viscosity may be leveled along the capillary coating, so as to acquire an effect that IJP dots in one island region may be leveled to n surrounding island regions, and Step eight, a second inorganic encapsulation layer 32 is manufactured by the chemical vapor deposition method to complete a subsequent process.

The embodiment of the present disclosure has the beneficial effects: the display substrate provided by the embodiment of the present disclosure forms the first grooves by forming at least one insulation layer in the bridge regions, and then the first inorganic encapsulation layer is correspondingly recessed at the positions of the first grooves to form the corresponding second grooves. The second grooves enable the two adjacent island regions to communicate. When the first organic encapsulation layer is subsequently formed on the surface of the first inorganic encapsulation layer by ink-jet printing, and the organic encapsulation material is printed on one island region, the organic encapsulation material of the current island can flow to the adjacent island regions in an extension direction of the second grooves. Therefore, by printing the organic encapsulation material on one island region to form the organic encapsulation layer covering the plurality of island regions, the quantity of ink-jet printing can be reduced, and the problem of long time required for printing each island region can be avoided.

Obviously, those skilled in the art can make various modifications and variants to the present disclosure without departing from the spirit and scope of the present disclosure. Thus, if these modifications and variants of the present disclosure fall within the scope of the claims of the present disclosure and their equivalents, the present disclosure is also intended to include these modifications and variants.

What is claimed is:

1. A display substrate, comprising:
a base substrate;
a plurality of island regions located on one side of the base substrate;
an empty region located between adjacent island regions;
a plurality of bridge regions, connecting the adjacent island regions, wherein each island region of the plurality of island regions comprises at least one pixel, and each bridge region of the plurality of bridge regions comprises signal lines connecting pixels in the adjacent island regions;
a first inorganic encapsulation layer, covering pixels of the island regions and the signal lines in the bridge regions;
a first organic encapsulation layer, covering the first inorganic encapsulation layer; and
a plurality of insulation layers, located between the first inorganic encapsulation layer and the base substrate in the bridge regions;
wherein at least one insulation layer of the plurality of insulation layers has at least one first groove recessed to one side of the base substrate in the bridge regions; and
the first inorganic encapsulation layer has corresponding concave second grooves at positions corresponding to the at least one first groove, the second grooves enable two adjacent island regions to communicate, and are configured to make a printing liquid flow to the adjacent island regions when forming the printing liquid of the first organic encapsulation layer of a current island region.

2. The display substrate according to claim 1, wherein each insulation layer comprises at least one of the followings sequentially located on one side of the base substrate:
a buffer layer;
a first gate insulation layer;
a second gate insulation layer;
an interlayer insulation layer;
a flat layer;
a pixel definition layer; and
a spacer.

3. The display substrate according to claim 2, wherein an orthographic projection of the at least one first groove on the base substrate covers orthographic projections of the signal lines on the base substrate;
the insulation layer comprises the buffer layer, the first gate insulation layer, the second gate insulation layer, the interlayer insulation layer, the flat layer, the pixel definition layer, and the spacer which are sequentially located on one side of the base substrate; and
the signal lines are located between the interlayer insulation layer and the flat layer, and the at least one first groove is recessed to the flat layer from a surface of one side of the spacer facing away from the pixel definition layer.

4. The display substrate according to claim 3, wherein the at least one first groove is recessed to an interior of the flat layer.

5. The display substrate according to claim 2, wherein an orthographic projection of the at least one first groove on the base substrate does not overlap orthographic projections of the signal lines on the base substrate;
the insulation layer comprises the buffer layer, the first gate insulation layer, the second gate insulation layer, the interlayer insulation layer, the flat layer, the pixel definition layer, and the spacer which are sequentially located on one side of the base substrate; and
the signal lines are located between the interlayer insulation layer and the flat layer, and the at least one first groove is recessed to the buffer layer from a surface of one side of the spacer facing away from the pixel definition layer.

6. The display substrate according to claim 5, wherein the at least one first groove is recessed to an interior of the buffer layer.

7. The display substrate according to claim 1, wherein the empty region is of a hollow structure.

8. The display substrate according to claim 1, wherein
a first surface and a second surface of the first organic encapsulation layer are in a same plane,
the first surface is a surface of the first organic encapsulation layer facing away from the first inorganic encapsulation layer in the island regions, and
the second surface is a surface of the first organic encapsulation layer facing away from the first inorganic encapsulation layer in the bridge regions.

9. The display substrate according to claim 8, wherein the display substrate further comprises a second organic encapsulation layer located between the first organic encapsulation layer and the first inorganic encapsulation layer; and
in a region where the at least one first groove is located, a thickness of the second organic encapsulation layer in a direction perpendicular to the base substrate is less than a thickness of the first organic encapsulation layer in the direction perpendicular to the base substrate.

10. The display substrate according to claim 9, wherein the second organic encapsulation layer covers only a bottom and a side wall of the at least one first groove.

11. The display substrate according to claim 8, wherein the display substrate further comprises: a second inorganic encapsulation layer located on one side of the first organic encapsulation layer facing away from the first inorganic encapsulation layer.

12. A display device, comprising a display substrate, wherein the display substrate comprises:
a base substrate;
a plurality of island regions located on one side of the base substrate;
an empty region located between adjacent island regions;
a plurality of bridge regions, connecting the adjacent island regions, wherein each island region of the plurality of island regions comprises at least one pixel, and each bridge region of the plurality of bridge regions comprises signal lines connecting pixels in the adjacent island regions;
a first inorganic encapsulation layer, covering pixels of the island regions and the signal lines in the bridge regions;
a first organic encapsulation layer, covering the first inorganic encapsulation layer; and
a plurality of insulation layers, located between the first inorganic encapsulation layer and the base substrate in the bridge regions;
wherein at least one insulation layer of the plurality of insulation layers has at least one first groove recessed to one side of the base substrate in the bridge regions; and
the first inorganic encapsulation layer has corresponding concave second grooves at positions corresponding to the at least one first groove, the second grooves enable two adjacent island regions to communicate, and are configured to make a printing liquid flow to the adjacent island regions when forming the printing liquid of the first organic encapsulation layer of a current island region.

13. A method for manufacturing the display substrate according to claim 1, comprising:
forming a plurality of insulation layers on one side of a base substrate;
forming at least one first groove in a bridge region of at least one insulation layer;
forming a first inorganic encapsulation layer on one side of the at least one first groove facing away from the insulation layers, wherein the first inorganic encapsulation layer has corresponding concave at positions corresponding to the at least one first groove to form second grooves; and
printing a printing liquid for forming a first organic encapsulation layer on one side of the first inorganic encapsulation layer facing away from the insulation layers, so that when printing a printing liquid of a current island region, the printing liquid flows to other island regions through the second grooves.

14. The method according to claim 13, wherein the printing the printing liquid for forming the first organic encapsulation layer on one side of the first inorganic encapsulation layer facing away from the insulation layers further comprises:
printing the printing liquid for forming the first organic encapsulation layer only on one of a plurality of island regions connected through the second grooves.

15. The method according to claim 13, wherein before the printing the printing liquid for forming the first organic encapsulation layer on one side of the first inorganic encapsulation layer facing away from the insulation layers, the method further comprises:
printing a printing liquid for forming a second organic encapsulation layer in the at least one first groove, wherein a viscosity of the printing liquid forming the second organic encapsulation layer is lower than a viscosity of the printing liquid forming the first organic encapsulation layer.

16. The display device according to claim 12, wherein each insulation layer comprises at least one of the followings sequentially located on one side of the base substrate:
a buffer layer;
a first gate insulation layer;
a second gate insulation layer;
an interlayer insulation layer;
a flat layer;
a pixel definition layer; and
a spacer.

17. The display device according to claim 16, wherein an orthographic projection of the at least one first groove on the base substrate covers orthographic projections of the signal lines on the base substrate;
the insulation layer comprises the buffer layer, the first gate insulation layer, the second gate insulation layer, the interlayer insulation layer, the flat layer, the pixel definition layer, and the spacer which are sequentially located on one side of the base substrate; and
the signal lines are located between the interlayer insulation layer and the flat layer, and the at least one first groove is recessed to the flat layer from a surface of one side of the spacer facing away from the pixel definition layer.

18. The display device according to claim 17, wherein the at least one first groove is recessed to an interior of the flat layer.

19. The display device according to claim 16, wherein an orthographic projection of the at least one first groove on the base substrate does not overlap orthographic projections of the signal lines on the base substrate;
the insulation layer comprises the buffer layer, the first gate insulation layer, the second gate insulation layer, the interlayer insulation layer, the flat layer, the pixel definition layer, and the spacer which are sequentially located on one side of the base substrate; and
the signal lines are located between the interlayer insulation layer and the flat layer, and the at least one first groove is recessed to the buffer layer from a surface of one side of the spacer facing away from the pixel definition layer.

20. The display device according to claim 19, wherein the at least one first groove is recessed to an interior of the buffer layer.

* * * * *